United States Patent
Andre et al.

(10) Patent No.: US 10,658,797 B2
(45) Date of Patent: May 19, 2020

(54) IO INTEGRATION WITH FLOATING CONNECTORS IN A MESH

(71) Applicant: Apple Inc., Cupertino, CA (US)

(72) Inventors: Bartley K. Andre, Menlo Park, CA (US); Mahmoud R. Amini, Sunnyvale, CA (US); Rui Zhou, Sunnyvale, CA (US); James E. Harper, Paso Robles, CA (US); Houtan R. Farahani, San Ramon, CA (US); Sung-Ho Tan, San Francisco, CA (US); Mariel L. Lanas, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/428,630

(22) Filed: May 31, 2019

(65) Prior Publication Data

US 2020/0099174 A1  Mar. 26, 2020

Related U.S. Application Data (60) Provisional application No. 62/736,360, filed on Sep. 25, 2018.

(51) Int. Cl.
*H01R 13/6594* (2011.01)
*H01R 13/6584* (2011.01)
(Continued)

(52) U.S. Cl.
CPC ......... *H01R 13/6594* (2013.01); *G06F 1/182* (2013.01); *H01R 13/514* (2013.01);
(Continued)

(58) Field of Classification Search
CPC .............. H01R 13/6594; H01R 13/514; H01R 13/6584; H01R 13/6587; H01R 13/6588;
(Continued)

(56) References Cited

U.S. PATENT DOCUMENTS

| 4,797,120 A | 1/1989 | Ulery |
| 5,622,523 A | 4/1997 | Kan et al. |

(Continued)

FOREIGN PATENT DOCUMENTS

| EP | 1081806 A1 | 3/2001 |
| WO | 2011156354 A2 | 12/2011 |

OTHER PUBLICATIONS

Conductive Elastomer Engineering Handbook, [online], Parker Hannifin Corporation, 2018, [retrieved on Jan. 8, 2020]. Retrieved from the Internet: <URL: https://www.sealingdevices.com/documents// Conductive_Elastomer_Eng_Handbook_2018_4-12-2_TABS_ONLINE.pdf>; 152 pages.

(Continued)

*Primary Examiner* — Harshad C Patel
(74) *Attorney, Agent, or Firm* — Kilpatrick Townsend & Stockton, LLP (57) ABSTRACT

Connector receptacles and device enclosures that can provide proper grounding, improved ventilation, and an aesthetically pleasing appearance. An example can include a device enclosure including an enclosure wall and sleeves for a number of connector receptacles. Each sleeve can electrically contact a shield of a corresponding connector receptacle via a conductive structure, such as a conductive gasket, to provide a good ground path. The sleeves can be narrow at the enclosure wall for improved ventilation and an aesthetically pleasing appearance.

20 Claims, 10 Drawing Sheets

(51) Int. Cl.
*G06F 1/18* (2006.01)
*H01R 24/60* (2011.01)
*H01R 13/6588* (2011.01)
*H01R 13/514* (2006.01)
*H01R 13/6592* (2011.01)
*H01R 13/6587* (2011.01)

(52) U.S. Cl.
CPC ..... *H01R 13/6584* (2013.01); *H01R 13/6587* (2013.01); *H01R 13/6588* (2013.01); *H01R 13/6592* (2013.01); *H01R 24/60* (2013.01)

(58) Field of Classification Search
CPC ............ H01R 13/6592; H01R 13/6596; H01R 13/6597; H01R 13/6599; H01R 24/60; H01R 13/6581; H01R 13/6582; G06F 1/182
USPC ................ 439/607.01, 607.28, 540.1, 541.5
See application file for complete search history.

(56) References Cited

U.S. PATENT DOCUMENTS

| | | | |
|---|---|---|---|
| 5,735,699 A | | 4/1998 | Tan et al. |
| 5,755,592 A | | 5/1998 | Hillbish et al. |
| 6,066,001 A | * | 5/2000 | Liptak ................... H01R 13/745 439/607.01 |
| 6,227,904 B1 | | 5/2001 | Wang et al. |
| 6,231,384 B1 | * | 5/2001 | Kuo ................... H01R 13/6582 439/545 |
| 6,238,241 B1 | * | 5/2001 | Zhu ...................... H01R 13/658 439/541.5 |
| 6,238,244 B1 | * | 5/2001 | Yang ................... H01R 13/658 439/607.01 |
| 6,359,214 B1 | | 3/2002 | Worley |
| 6,483,023 B1 | | 11/2002 | Jacques |
| 6,508,653 B2 | * | 1/2003 | Malone ................... G06F 1/182 439/92 |
| 6,824,403 B2 | | 11/2004 | Hall et al. |
| 6,835,070 B1 | | 12/2004 | Law |
| 7,322,854 B2 | * | 1/2008 | Long ................... H05K 9/0058 439/607.28 |
| 7,473,131 B2 | | 1/2009 | Dunwoody |
| 7,481,676 B2 | * | 1/2009 | Walter ................ H01R 13/518 439/607.01 |
| 7,510,430 B2 | | 3/2009 | Zhang et al. |
| 7,934,848 B1 | * | 5/2011 | Pever ........................ F21S 8/02 362/146 |
| 8,096,834 B2 | | 1/2012 | Lai et al. |
| 8,298,016 B2 | | 10/2012 | Lai et al. |
| 8,500,486 B2 | | 8/2013 | Buck et al. |
| 8,672,710 B2 | | 3/2014 | Feldstein et al. |
| 8,721,364 B2 | | 5/2014 | Lai et al. |
| 8,968,031 B2 | * | 3/2015 | Simmel ................ H01R 13/659 439/660 |
| 9,176,357 B2 | | 11/2015 | Lam et al. |
| 9,799,995 B1 | * | 10/2017 | Zhou ................... H01R 13/659 |
| 2004/0180574 A1 | | 9/2004 | Liu |
| 2007/0128936 A1 | | 6/2007 | Long et al. |
| 2009/0305575 A1 | * | 12/2009 | Lin ........................ H01R 13/64 439/676 |
| 2015/0056854 A1 | * | 2/2015 | Scholeno ........... H01R 13/6595 439/540.1 |
| 2016/0056585 A1 | | 2/2016 | Dunwoody et al. |

OTHER PUBLICATIONS

U.S. Appl. No. 16/428,603 (Unpublished), filed May 31, 2019, titled "Floating Connector System With Integrated EMI Gasket," Zhou, et al., 49 pages.
U.S. Appl. No. 16/428,696 (Unpublished), filed May 31, 2019, titled "Audio Jack Having Integrated Grounding," Amini, et al., 38 pages.
First Action Interview Pilot Program Pre-Interview Communication dated Jan. 14, 2020 in U.S. Appl. No. 16/428,603, 10 pages.
Extended European Search Report dated Mar. 4, 2020 in European Patent Application No. 19177647.5, 11 pages.

* cited by examiner

IO INTEGRATION WITH FLOATING CONNECTORS IN A MESH

CROSS-REFERENCES TO RELATED APPLICATIONS

This application claims the benefit of U.S. provisional patent application No. 62/736,360, filed Sep. 25, 2018, which is incorporated by reference.

BACKGROUND

Power and data can be provided from one electronic device to another over cables that can include one or more wires, fiber optic cables, or other conductors. Connector inserts can be located at each end of these cables and can be inserted into connector receptacles in communicating or power transferring electronic devices.

These connector receptacles can be located at a surface of device enclosure of an electronic device. The device enclosure can be conductive and grounded. The connector receptacles can include ground contacts and shielding that can also be grounded. But improper or insufficient grounding of the device enclosure or connector receptacle can generate signal noise. This noise can limit a data rate of signals conveyed by the connector receptacles. This signal noise can also cause electromagnetic interference and data transmission errors. For improved performance, it can be desirable that the device enclosure and connector receptacles be properly grounded.

These electronic devices can include circuits, such as central processing units, graphics processing circuits, and other circuits. These circuits can consume large amounts of power and dissipate a great deal of heat. This heat can compromise device performance. For example, this heat can shorten circuit lifetime and can slow the circuits of the electronic devices. It can therefore be desirable that the device enclosure allow this heat to escape. That is, it can be desirable to provide device enclosures having improved ventilation.

The appearance of these device enclosures and connector receptacles can be perceived to reflect upon the quality and value of the electronic devices. A poor appearance can give a user a poor impression. In contrast, an aesthetically pleasing appearance can provide a user with a sense of quality and value.

Thus, what is needed are connector receptacles and device enclosures that can provide proper grounding, improved ventilation, and have an aesthetically pleasing appearance.

SUMMARY

Accordingly, embodiments of the present invention can provide connector receptacles and device enclosures that provide a proper grounding, improved ventilation, and have an aesthetically pleasing appearance.

An illustrative embodiment of the present invention can provide connector receptacles and device enclosures that are properly grounded. A device enclosure for an electronic device can provide an enclosure wall having openings through which plugs or connector inserts can be inserted into corresponding connector receptacles. The enclosure wall can include sleeves for some or all of the connector receptacles. These sleeves can extend from the enclosure wall into the electronic device. The connector receptacles can have front ends that can each be inserted in a corresponding sleeve. The front ends of the connector receptacles can be at least partially shielded. The shielding can be electrically connected to the sleeve by a conductive structure. The shielding can further be electrically connected to traces or pads of a board or other appropriate substrate on which the connector receptacles are mounted. This ground path from the enclosure wall, through the sleeve, conductive structure, connector receptacle shielding, and board ground plane can provide a proper ground path for the connector receptacles and device enclosures.

In these and other embodiments of the present invention, the enclosure wall and sleeves can be integrally formed. In these and other embodiments of the present invention, the enclosure wall and sleeves can be formed separately. The sleeves can then be attached to the enclosure wall, for example by soldering, laser or spot welding, or other technique.

In these and other embodiments of the present invention, the conductive structure can be a compliant or pliable structure to provide a good contact force between the sleeve and the connector insert shielding. For example, the conductive structure can be a gasket, O-ring, or other structure. The conductive structure can encircle a front end of the connector receptacle. The conductive structure can instead be formed in sections around the front end of the connector receptacle. The conductive structure can have a sloped leading edge or otherwise be shaped to facilitate the insertion of the conductive structure and connector receptacle front end into a corresponding sleeve. A conductive adhesive can secure the conductive structure in place. The conductive adhesive can be a pressure-sensitive adhesive, heat-activated adhesive, temperature-sensitive adhesive, or other type of adhesive. The conductive structure can be formed of a conductive material or it can have a conductive layer over all or some of its surface.

These and other embodiments of the present invention can provide device enclosures having improved ventilation. For example, an enclosure wall can be formed as a mesh or other non-solid surface. In these and other embodiments of the present invention, the enclosure wall can be formed to have the appearance of being a mesh. The enclosure wall can include a pattern of perforations or holes to allow the passage of air to improve ventilation. For example, a pattern of holes can be formed in the enclosure wall to give the enclosure wall a mesh-like appearance.

In these and other embodiments of the present invention, the sleeves can be arranged to help to improve air flow though the mesh of the enclosure wall. For example, the enclosure wall can have an opening for a connector receptacle. A sleeve can have a front opening or front aperture aligned with the enclosure wall opening. In these and other embodiments of the present invention, the front aperture can have a minimum width to accept a corresponding connector insert. The sleeve can have a thickness that is limited to at least approximately the thickness of the mesh of the enclosure wall. This limited profile for a connector receptacle front end can improve ventilation through the enclosure wall.

The sleeve can act as a shield at the front of the connector receptacle. This can allow a shield around the connector receptacle to be pulled back away from the enclosure wall thereby allowing a narrower sleeve front aperture. This narrow front end to the sleeve can help to further improve ventilation and prevent air flow through the enclosure wall from being blocked by the sleeves and connector receptacles.

A sleeve can taper to a rear aperture away from the enclosure wall and inside the electronic device. The rear aperture can be wider or larger than the front aperture and it can be wide enough to accept a front end of a connector receptacle. The sleeve can widen in steps from the front aperture to the rear aperture. The sleeve can instead widen in a line or curve from the front aperture to the rear aperture. In these and other embodiments of the present invention, the sleeve can have other widening contours. In these and other embodiments of the present invention, the sleeves can maintain their width, they can have narrowing portions, or they can have other contours. The conductive structure can be located between the connector receptacle front end and the sleeve and away from the enclosure wall. This can allow additional narrowing of the sleeve near the enclosure wall for further improved ventilation.

These and other embodiments of the present invention can provide connector receptacles and device enclosures having an aesthetically pleasing appearance. For example, even though an enclosure wall can have a number of holes or perforations for a mesh appearance, the connector receptacles might only be visible to a limited extent. For example, tapered sleeves can provide a minimal front aperture for an improved appearance. The tapered sleeves can limit the visibility of the connector receptacles and their structures as viewed from outside the electronic device. The tapered sleeves can further effectively hide the conductive structures used to connect the sleeves and connector receptacles. Locating the conductive structures between the connector receptacle front ends and the sleeves and away from the enclosure wall can allow the conductive structures to be set further back into the electronic device, thereby making the connector receptacles less visible. Some or all of the enclosure walls, sleeves, and connector receptacle shields can be darkened to absorb light and reduce reflections. In these and other embodiments of the present invention, portions of connector receptacle tongues or other structures can similarly be darkened to absorb light, reduce reflections, and match an enclosure wall. Some of all of these structures can be darkened using a conductive black PVD (physical vapor deposition) process, cosmetic tape, paint, pad printing, plating, laser darkening, or other process or material. In these and other embodiments of the present invention, a printed circuit board supporting the connector receptacles can be colored to match one or more of the enclosure wall, sleeves, and connector receptacle. For example, these structures can each be colored black, though they can have other colors as well. This can give the connector receptacles at openings in the enclosure wall the appearance that they are floating in the mesh of the enclosure wall.

These enclosure walls and sleeves can be formed in various ways in these and other embodiments of the present invention. For example, they can be formed by machining, such as by using computer numerical controlled machines, stamping, forging, metal-injection molding, micro-machining, 3-D printing, or other manufacturing process. These enclosure walls and sleeves can be formed of various materials. For example, they can be formed of aluminum, steel, stainless steel, copper, bronze, or other material. In these and other embodiments of the present invention, a material having good electrical and thermal conductivity can be chosen.

In various embodiments of the present invention, contacts, ground pads, enclosure walls, sleeves, shields, and other portions of connector receptacles and device enclosures can be formed by stamping, metal-injection molding, machining, micro-machining, 3-D printing, or other manufacturing process. These portions can be formed of stainless steel, steel, copper, copper titanium, phosphor bronze, or other material or combination of materials. They can be plated or coated with nickel, gold, or other material. Other portions, such as connector receptacle housings and other structures can be formed using injection or other molding, 3-D printing, machining, or other manufacturing process. These portions can be formed of silicon or silicone, rubber, hard rubber, plastic, nylon, liquid-crystal polymers (LCPs), ceramics, or other nonconductive material or combination of materials.

Embodiments of the present invention can provide connector receptacles and device enclosures that can be located in, or can connect to, various types of devices, such as portable computing devices, tablet computers, desktop computers, laptops, all-in-one computers, wearable computing devices, smart phones, storage devices, portable media players, navigation systems, monitors, power supplies, video delivery systems, adapters, remote control devices, chargers, and other devices. These connector receptacles can provide interconnect pathways for signals that are compliant with various standards such as one of the Universal Serial Bus (USB) standards including USB Type-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. Other embodiments of the present invention can provide connector receptacles that can be used to provide a reduced set of functions for one or more of these standards. In various embodiments of the present invention, interconnect paths provided by these connector receptacles can be used to convey power, ground, signals, test points, and other voltage, current, data, or other information.

Various embodiments of the present invention can incorporate one or more of these and the other features described herein. A better understanding of the nature and advantages of the present invention can be gained by reference to the following detailed description and the accompanying drawings.

DESCRIPTION OF ILLUSTRATIVE EMBODIMENTS

Figure 1:
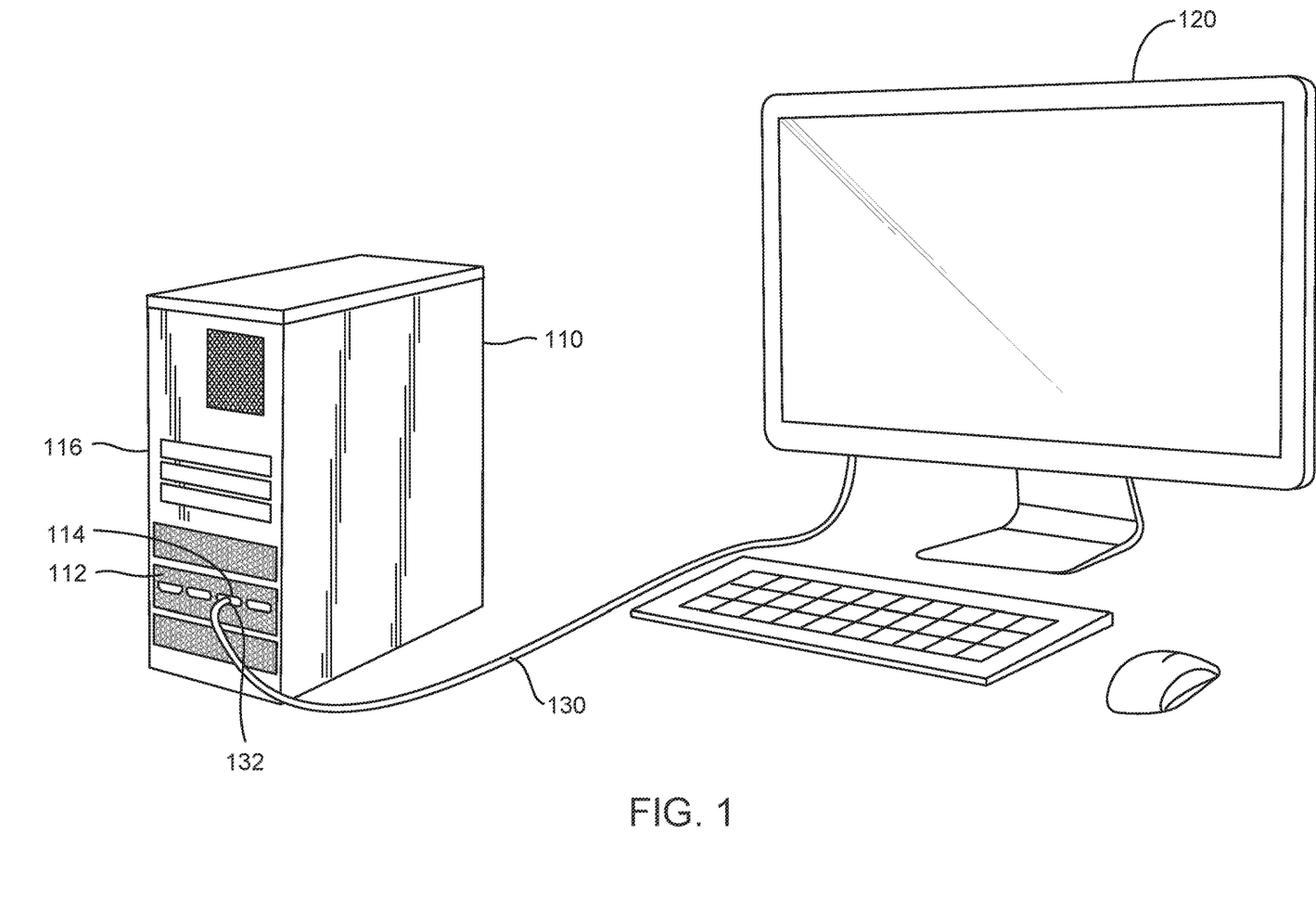
FIG. 1 illustrates an electronic system according to an embodiment of the present invention.

FIG. 1 illustrates an electronic system according to an embodiment of the present invention. This figure, as with the other included figures, is shown for illustrative purposes and does not limit either the possible embodiments of the present invention or the claims.

In this example, an electronic system can include desktop computer 110 that is in communication with monitor 120. Desktop computer 110 can include a Peripheral Component Interconnect Express (PCIe) card or computer expansion card or other electronic device 300 (shown in FIG. 10) having enclosure wall 112. Desktop computer 110 can be housed in a device enclosure including case 116 and enclosure wall 112. Desktop computer 110 can use computer expansion card or other electronic device 300 to provide graphics information over cable 130 to monitor 120. In these and other embodiments of the present invention, computer expansion cards such as computer expansion card or other electronic device 300 can provide graphics, sound, networking, and other functions for desktop computer 110.

Cable 130 can be one of a number of various types of cables. For example, it can be a Universal Serial Bus (USB) cable such as a USB Type-A cable, USB Type-C cable, HDMI, Thunderbolt, DisplayPort, Lightning, or other type of cable. Cable 130 can include compatible connector inserts 132 that plug into connector receptacle 114 on desktop computer 110 and a connector receptacle (not shown) on monitor 120. Computer expansion card or other electronic device 300 can include additional connector receptacles, audio jacks, or other connectors along with connector receptacle 114.

In other embodiments of the present invention, either or both desktop computer 110 and monitor 120 can instead be portable computing devices, tablet computers, desktop computers, laptops, all-in-one computers, wearable computing devices, smart phones, storage devices, portable media players, navigation systems, monitors, power supplies, video delivery systems, adapters, remote control devices, chargers, or other devices.

Figure 2:
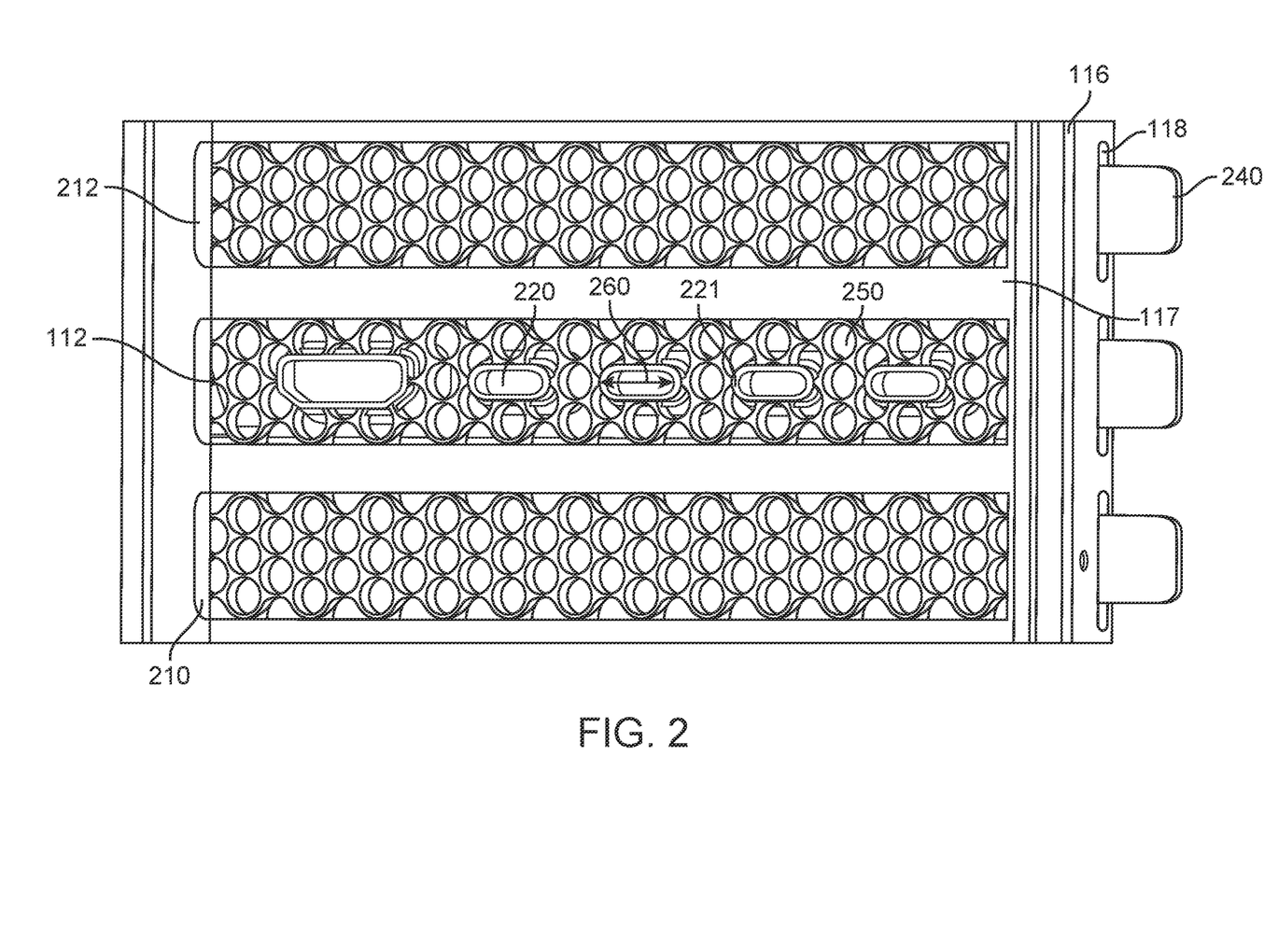
FIG. 2 illustrates a portion of a device enclosure according to an embodiment of the present invention.

FIG. 2 illustrates a portion of a device enclosure according to an embodiment of the present invention. In this example, enclosure wall 112 of computer expansion card or other electronic device 300 (shown in FIG. 10) can be located in case 116. Additional enclosure walls 210 and 212 can also be located in case 116. Additional enclosure walls 210 and 212 can be standalone covers or they can be enclosure walls for other computer expansion cards or electronic devices. Enclosure walls 112, 210, and 212 can be held in place by horizontal frame portions 117. Tabs 240 on enclosure walls 112, 210, and 212 can pass through openings 118 in case 116.

These and other embodiments of the present invention can provide device enclosures, such as enclosure wall 112, having improved ventilation. For example, enclosure wall 112 can be formed as a mesh or other non-solid surface. In these and other embodiments of the present invention, enclosure wall 112 can be formed to have the appearance of being a mesh. Enclosure wall 112 can include a pattern of holes or perforations 250 to allow the passage of air to improve ventilation. For example, a pattern of holes or perforations 250 can be formed in enclosure wall 112 to give enclosure wall 112 a mesh-like appearance.

Accordingly, enclosure walls 112, 210, and 212 can have a mesh-like appearance. That is, holes or perforations 250 can be formed in enclosure walls 112, 210, and 212. In these and other embodiments of the present invention, enclosure walls 112, 210, and 212 can instead be formed already having holes or perforations 250. These holes or perforations 250 can allow improved ventilation for computer expansion card or other electronic device 300 inside case 116. In this example, enclosure wall 112 can further include openings 220 for one or more connector receptacles 320 (shown in FIG. 3.) Openings 220 can have a minimal size or front aperture 260 while still being able to accept a corresponding connector insert (not shown.) Openings 220 can be surrounded by an enclosure opening ring 221 having a thickness that is limited to at least approximately the thickness of the mesh, where the thickness of the mesh is the lateral thickness of the mesh of enclosure wall 112 between adjacent holes or perforations 250. The reduced size of enclosure opening ring 221 can help to preserve the mesh appearance at the surface of enclosure wall 112. This reduced size can also help to improve ventilation for computer expansion card or other electronic device 300 by reducing the size of structures that can otherwise block holes or perforations 250 in enclosure wall 112. Further details of enclosure walls 112, including their structure, methods of manufacturing, and the materials that can be used, can be found in co-pending U.S. Provisional Patent Application No. 62/736,299, titled "HOUSING CONSTRUCTION," filed Sep. 25, 2018, and co-pending U.S. patent application Ser. No. 16/412,240, titled "HOUSING CONSTRUCTION," filed May 14, 2019, which are incorporated by reference.

In these and other embodiments of the present invention, ventilation can be further improved by employing sleeves 310 (shown in FIG. 3) as front openings for connector receptacles 320. These sleeves 310 can be integrally formed with enclosure wall 112. In these and other embodiments of the present invention, these sleeves 310 can be formed separately from enclosure wall 112 and then attached to enclosure wall 112 by soldering, spot or laser welding, or other method. Sleeves 310 can further help to reduce the size of structures that can otherwise block holes or perforations 250 in enclosure wall 112. Sleeves 310 can also allow structures to be positioned away from enclosure wall 112 further into the electronic device such that ventilation is further improved. Examples of these sleeves 310 are shown in the following figures.

Figure 3:
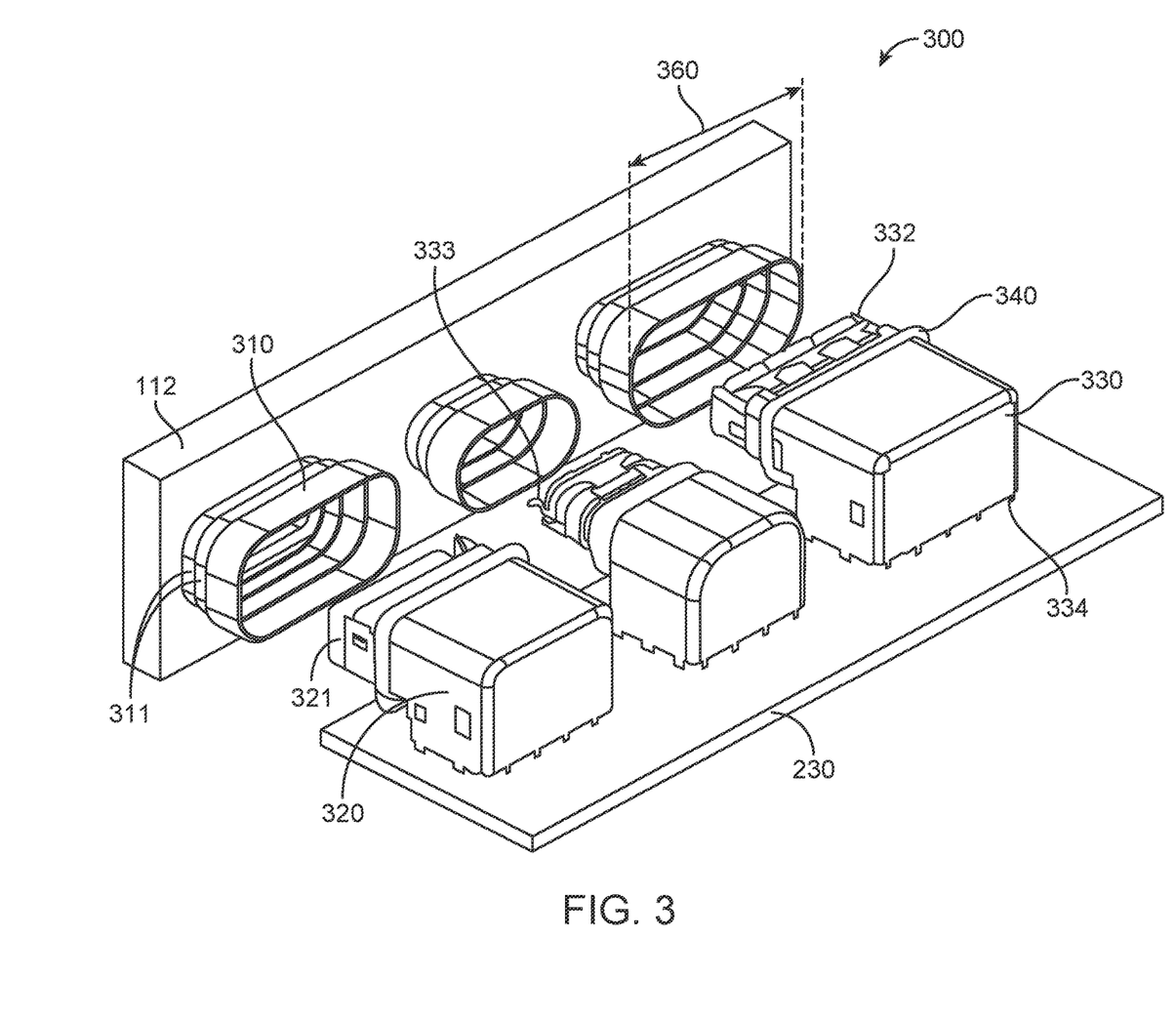
FIG. 3 illustrates a portion of a computer expansion card or other electronic device according to an embodiment of the present invention.
Figure 6:
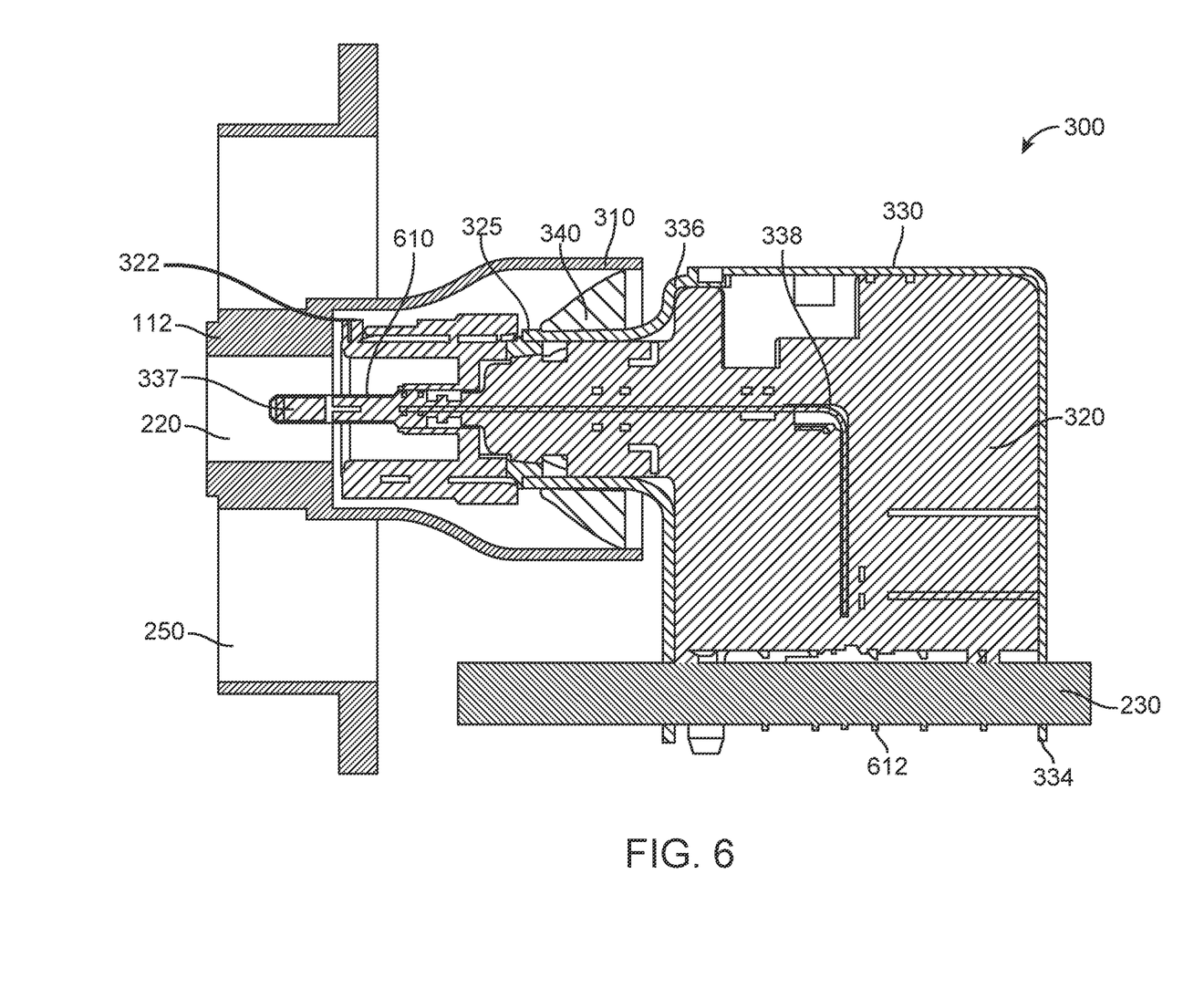
FIG. 6 is a cutaway side view of a portion of a computer expansion card or other electronic device according to an embodiment of the present invention.

FIG. 3 illustrates a portion of a computer expansion card or other electronic device according to an embodiment of the present invention. Connector receptacle 114 in FIG. 1 can correspond to a combination of sleeve 310 and connector receptacle 320. Sleeves 310 can extend from enclosure wall 112. Sleeves 310 can progressively widen away from enclosure wall 112. Sleeves 310 can have a front aperture 260 (shown in FIG. 2) that can align with opening 220 (shown in FIG. 2.) Sleeves 310 can have a wider, rear aperture 360 away from enclosure wall 112. In this example, sleeves 310 can progressively widen in steps 311. In these and other embodiments of the present invention, sleeves 310 can be tapered following a straight line, curve, or other contour. An example of this is shown in FIG. 6. In these and other embodiments of the present invention, sleeves 310 can have other widening contours. In these and other embodiments of the present invention, sleeves 310 can maintain their width, they can have narrowing portions, or they can have other contours.

In these and other embodiments of the present invention, sleeves 310 can be arranged to help to improve air flow though the mesh of enclosure wall 112. For example, enclosure wall 112 can have opening 220 for connector receptacle 320. Sleeve 310 can have a front opening or front aperture 260 aligned with enclosure wall opening 220. In these and other embodiments of the present invention, front aperture 260 can have a minimum width to accept a corresponding connector insert (not shown.) Sleeve 310 can have a thickness that is limited to at least approximately the thickness of the mesh of enclosure wall 112. This limited profile for a connector receptacle front end can improve ventilation through the enclosure wall.

Sleeve 310 can also act as a shield at the front of connector receptacle 320. This can allow shielding for connector receptacle 320, such as front portion 325 (shown in FIG. 8) of front shield 336 (shown in FIG. 8), to be pulled back away from enclosure wall 112, thereby allowing a narrower front aperture 260 of sleeve 310. This further narrowing can help to further improve ventilation and can prevent air flow through enclosure wall 112 from being blocked by sleeves 310 and connector receptacles 320.

Again, these sleeves 310 can taper to a rear aperture 360 away from enclosure wall 112. Rear aperture 360 can be wider or larger than front aperture 260 and it can be wide enough to accept front end 321 of connector receptacles 320. Conductive structures 340 can be located between a portion of connector receptacle front end 321 and sleeve 310 and away from enclosure wall 112. This can allow further narrowing of sleeve 310 near enclosure wall 112 for still further improved ventilation.

Connector receptacles 320 can be attached to board 230. Front ends 321 of connector receptacles 320 can be inserted into sleeves 310. Connector receptacles 320 can include ground contacts 332, side ground contacts 333, or other grounding features. The widening configuration of sleeves 310 can provide room for these ground contacts 332, side ground contacts 333, and other grounding features.

Connector receptacles 320 can include shields 330. Shields 330 can be electrically connected to sleeves 310 via conductive structures 340 and front shield 336. Conductive structures 340 can be compliant or pliable structures such that they provide adequate contacting force between sleeves 310 and front shield 336. Conductive structures 340 can be conductive gaskets, O-rings, or other structures. Conductive structures 340 can encircle portions of front ends 321 of connector receptacle 320. Conductive structures 340 can instead be placed in sections around front ends 321 of connector receptacles 320. Conductive structures 340 can have sloped leading edges or otherwise be shaped to facilitate the insertion of conductive structures 340 and connector receptacle front ends 321 into a corresponding sleeves 310. A conductive adhesive (not shown) can secure each conductive structure 340 in place. The conductive adhesive can be a pressure sensitive adhesive, heat-activated adhesive, temperature-sensitive adhesive, or other type of adhesive. Conductive structures 340 can be formed of a conductive material or they can have a conductive layer over all or some of their surfaces. Further details of these conductive structures, such as conductive structures 340, can be found in co-pending U.S. Provisional Application No. 62/736,344, titled "FLOATING CONNECTOR SYSTEM WITH INTEGRATED EMI GASKET," filed Sep. 25, 2018, and co-pending U.S. application Ser. No. 16/428,603, titled "FLOATING CONNECTOR SYSTEM WITH INTEGRATED EMI GASKET," filed May 31, 2019, which are incorporated by reference.

Shields 330 of connector receptacles 320 can include tabs 334. Tabs 334 can be soldered, for example using wave, reflow, or other solder techniques, in through holes in board 230 to form electrical connections with one or more ground planes (not shown) in board 230. In this way, a ground path from enclosure wall 112 and sleeve 310, through conductive structure 340, front shield 336, shield 330, tabs 334, and a ground plane (not shown) in board 230 can be formed.

Specifically, these and other embodiments of the present invention can provide connector receptacles 320 and enclosure walls 112 that are properly grounded. A device enclosure for an electronic device can provide enclosure wall 112 having openings 220 through which connector inserts (not shown) can be inserted into corresponding connector receptacles 320. Enclosure wall 112 can further include a sleeve 310 for some or all of connector receptacles 320. These sleeves 310 can extend from the enclosure wall 112 into the electronic device. Connector receptacles 320 can have front ends 321 that can be inserted in the sleeve 310. Front ends 321 of connector receptacles 320 can be partially shielded by front shields 336. Shields 330 can be electrically connected to sleeves 310 by conductive structures 340 and front shields 336. Shields 330 can further be electrically connected to traces or ground planes (not shown) of board 230 or other appropriate substrate on which connector receptacles 320 are mounted. This ground path from the enclosure wall 112, through the sleeve 310, conductive structure 340, front shield 336, connector receptacle shield 330, tabs 334, and board ground planes in board 230 can provide a proper ground path for computer expansion card or other electronic device 300.

In this example, enclosure wall 112 is shown as being solid, that is, without holes or perforations 250 (shown in FIG. 2.) In these and other embodiments, enclosure wall 112 can be solid, it can have a mesh like appearance, or it can have other forms.

In these and other embodiments of the present invention, computer expansion card or other electronic device 300 can be a computer expansion card or a portion of an electronic device. Enclosure wall 112 can be a portion of an enclosure for a computer expansion card, or it can be a portion of a device enclosure housing an electronic device. Board 230 can be a board for a computer expansion card, a main logic board, or other type of board. It can be a printed circuit board or other appropriate substrate. Board 230 can be formed of FR4 or other material.

Figure 4:
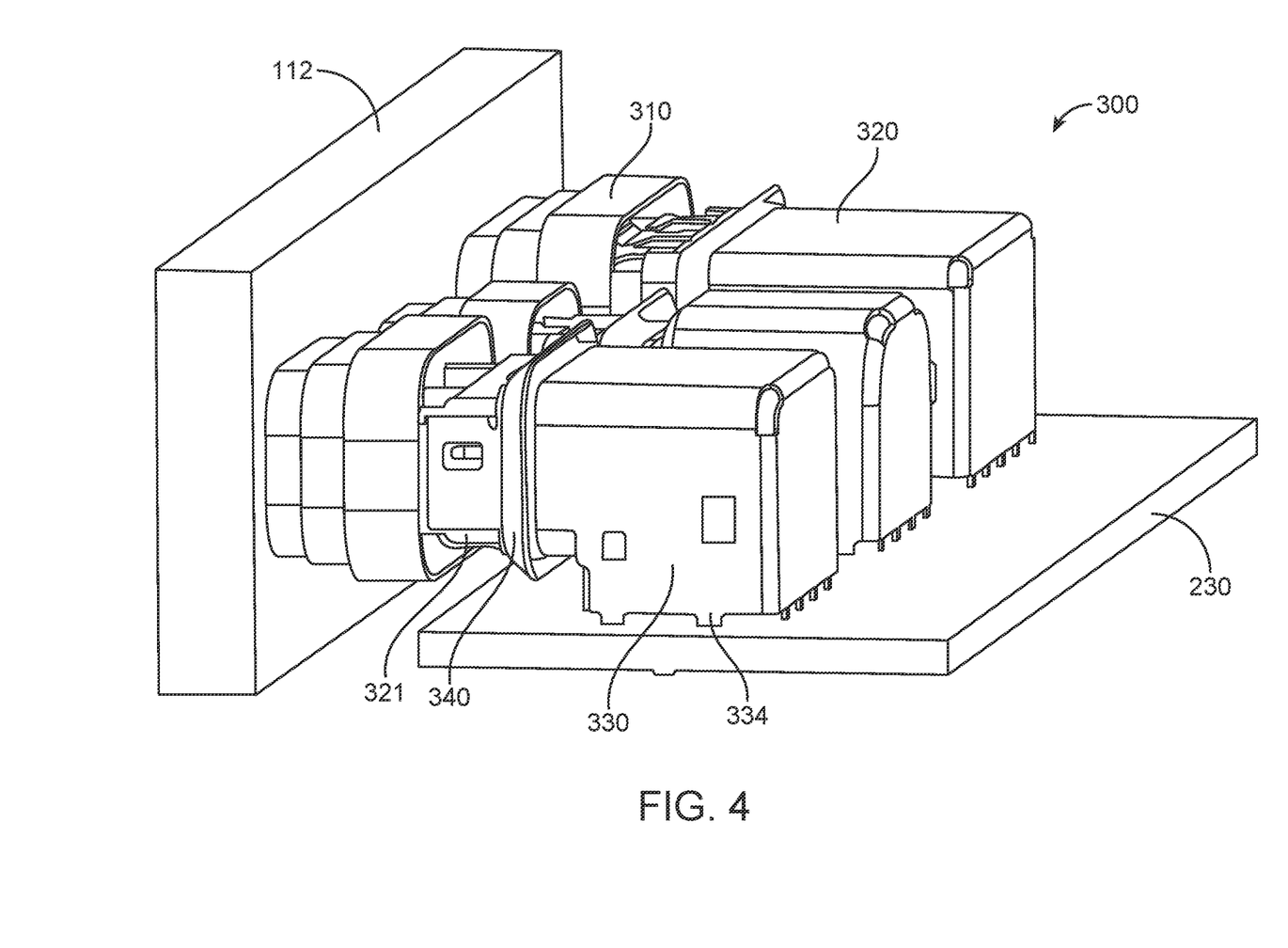
FIG. 4 illustrates a portion of a computer expansion card or other electronic device according to an embodiment of the present invention.

FIG. 4 illustrates a portion of a computer expansion card or other electronic device according to an embodiment of the present invention. In this example, sleeves 310 can extend from enclosure wall 112 in computer expansion card or other electronic device 300. Front ends 321 of connector receptacles 320 can be inserted into sleeves 310. Conductive structures 340 can electrically connect sleeves 310 to shields 330 of connector receptacles 320 via front shields 336 (shown in FIG. 8.) Tabs 334 can extend from shields 330 and can be inserted into through holes in board 230 to form electrical connections with one or more ground planes (not shown) in board 230.

Figure 5:
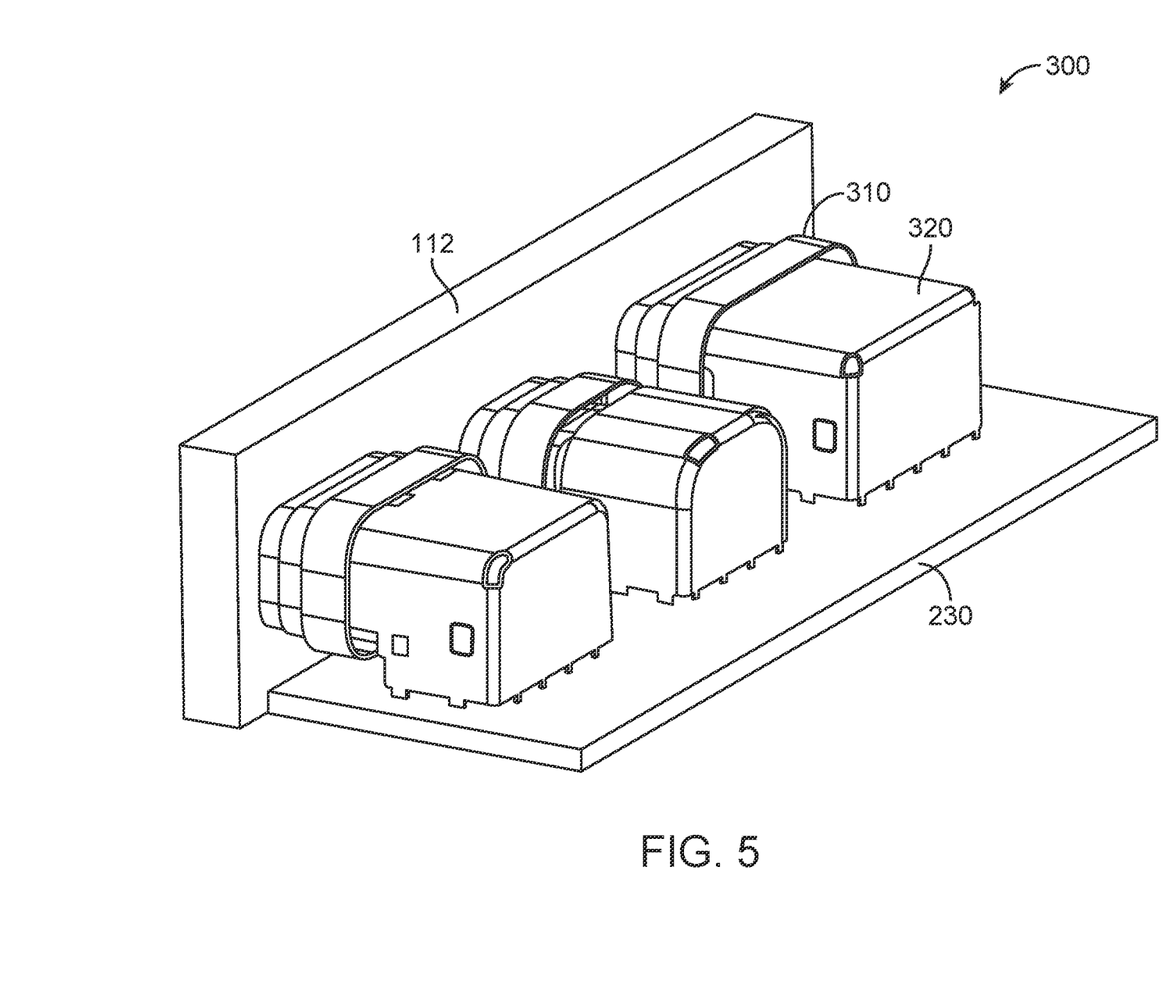
FIG. 5 illustrates a portion of a computer expansion card or other electronic device according to an embodiment of the present invention.

FIG. 5 illustrates a portion of a computer expansion card or other electronic device according to an embodiment of the present invention. In this example, connector receptacles 320 have been mated with sleeves 310, which can extend from enclosure wall 112. Connector receptacles 320 can be mounted on board 230 in computer expansion card or other electronic device 300.

FIG. 6 is a cutaway side view of a portion of a computer expansion card or other electronic device according to an embodiment of the present invention. In this example, connector receptacle 320 can include tongue 337. Tongue 337 can include contacting portions 610 of a number of contacts (not shown) on its top and bottom sides. These contacts can terminate in through-hole tails 612, which can be through-hole contacting portions that can be inserted into through holes (not shown) in board 230. Through-hole tails 612 can be soldered in the through holes in board 230, for example using wave, reflow, or other solder techniques. In these and other embodiments of the present invention, through-hole tails 612 can be replaced by surface-mount contacting portions.

Tongue 337 can be located in opening 220 in enclosure wall 112. Sleeve 310 can be integrally formed with, and extend from, enclosure wall 112. In these and other embodiments of the present invention, sleeve 310 can be formed separately from enclosure wall 112 and then attached to enclosure wall 112, for example by soldering or spot or laser welding. Sleeve 310 can be contoured such that it is wider away from enclosure wall 112. Enclosure wall 112 can further include holes or perforations 250 to give enclosure wall 112 a mesh-like appearance. Front end 321 (shown in FIG. 3) of connector receptacle 320 can be inserted into sleeve 310. Front end 321 of connector receptacle 320 can include nonconductive housing 322 and front portion 325 (shown in FIG. 8) of front shield 336 (shown in FIG. 8.) Shield 330 can be electrically connected to sleeve 310 via conductive structure 340 and front shield 336. Front shield 336 can be pulled back from enclosure wall 112. This can allow sleeve 310 to be narrower, thereby improving ventilation as well as device appearance. Shield 330 can further connect to center ground plane 338 in connector receptacle 320. Tabs 334 can extend from shield 330 and can be soldered in a through hole in board 230.

In this example, a connector receptacle having a tongue, such as a USB Type-C connector receptacle, is shown. In these and other embodiments of the present invention, other types of connector receptacles, such as USB Type-A, High-Definition Multimedia Interface, Digital Visual Interface, Ethernet, DisplayPort, Thunderbolt, Lightning, and other connector receptacles, can be included on computer expansion card or other electronic device 300.

Figure 7:
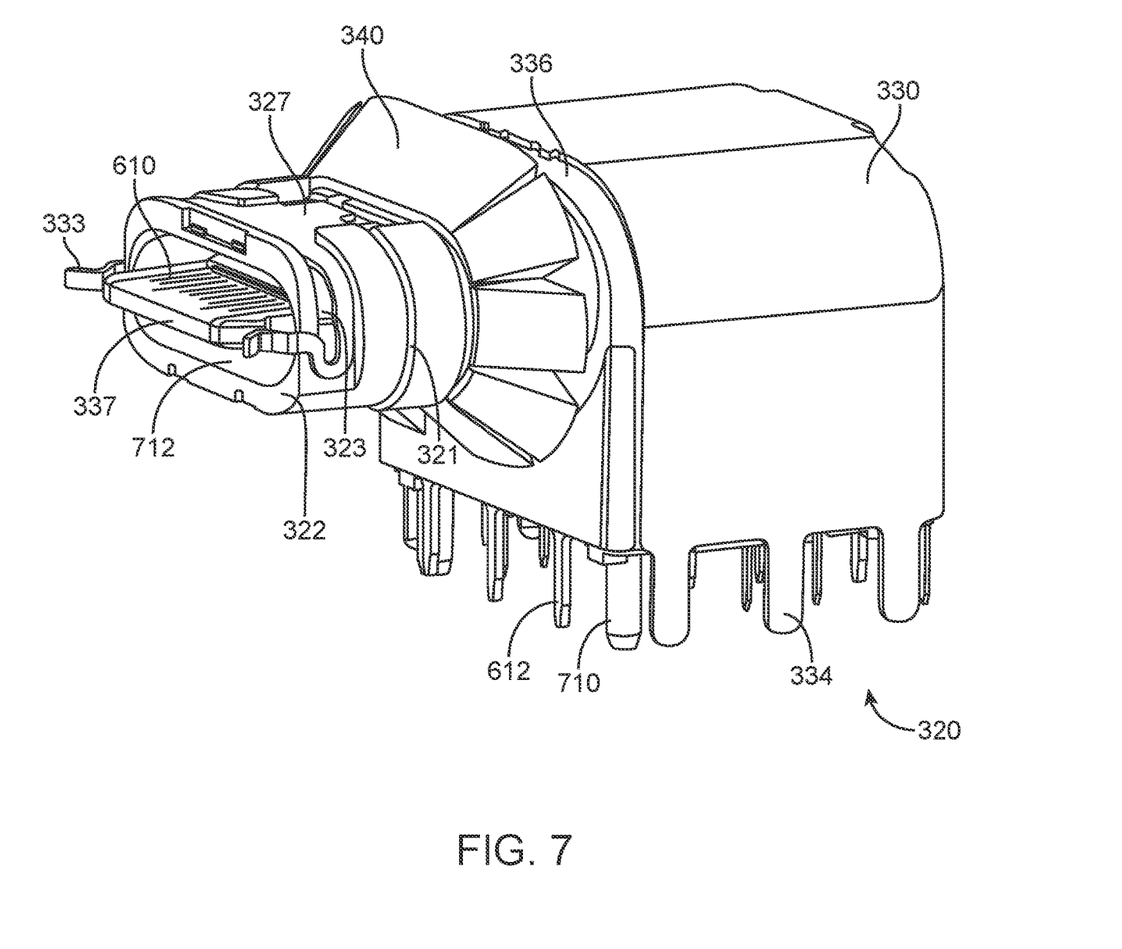
FIG. 7 is a more detailed view of a connector receptacle according to an embodiment of the present invention.

FIG. 7 is a more detailed view of a connector receptacle according to an embodiment of the present invention. Connector receptacle 320 can include front end 321, which can further include housing 322 and front portion 325 (shown in FIG. 8) of front shield 336 (shown in FIG. 8.) Housing 322 can include front opening 712 for tongue 337. Tongue 337 can support contacting portions 610 of contacts (not shown) on a top and bottom side. These contacts can terminate in through-hole tails 612. Through-hole tails 612 can be inserted into through holes (not shown) in printed circuit board 230 (shown in FIG. 2.) Housing 322 can include slot 323 that supports side ground contacts 333. Side ground contacts 333 can include center tab 327, which can electrically connect to front shield 336. Conductive structure 340 can encircle front portion 325 of front shield 336. Connector receptacle 320 can be shielded by shield 330, which can be spot or laser-welded to front shield 336, though shield 330 and front shield 336 can be formed as a single piece in these and other embodiments of the present invention. Shield 330 can include tabs 334. Tabs 334 can be inserted into openings in board 230. Tabs 334 and through-hole tails 612 can be soldered, for example using wave, reflow, or other solder techniques, in corresponding through holes (not shown) in board 230 to form electrical connections with one or more ground or power planes, signal traces, or other conductive paths (not shown) in board 230. Posts 710 can provide alignment to board 230 for connector receptacle 320. Posts 710 can be inserted into openings (not shown) in board 230.

Figure 8:
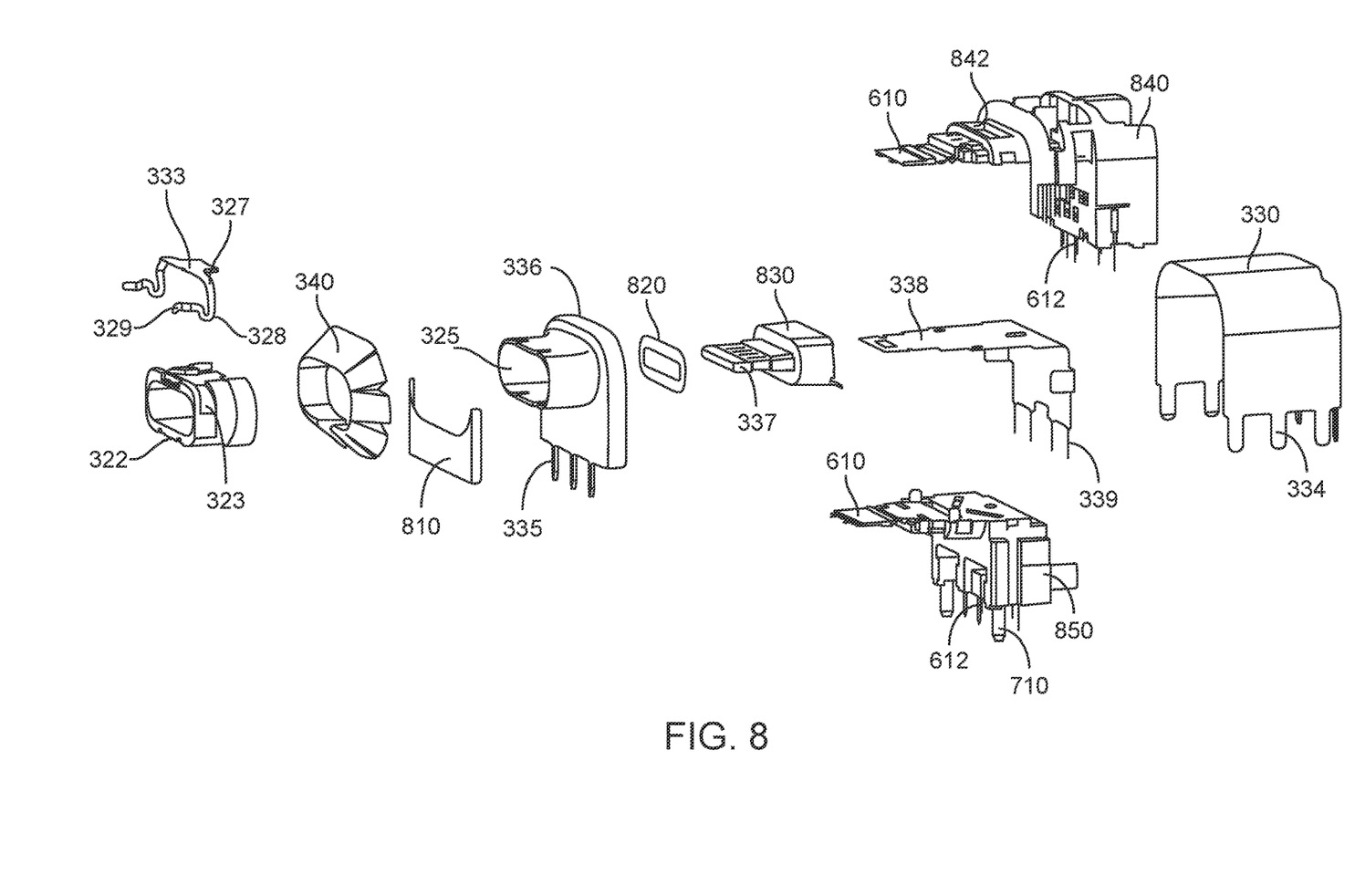
FIG. 8 is an exploded view of a connector receptacle according to an embodiment of the present invention.

FIG. 8 is an exploded view of a connector receptacle according to an embodiment of the present invention. Nonconductive housing 322 can include slot 323 for supporting side ground contacts 333. Side ground contacts 333 can include center tab 327. Center tab can be joined to contacting portions 329 by arms that can include looped portions 328. Contacting portions 329 can physically and electrically connect to a shield of a corresponding connector insert (not shown) when the connector insert is mated with connector receptacle 114 (shown in FIG. 1.) Conductive structure 340 can wrap around or encircle front portion 325 of front shield 336. Front shield 336 can shield at least a portion of front end 321. Front shield 336 can include tabs 335, which can be inserted and soldered into openings in board 230 (shown in FIG. 2) using wave, reflow, or other solder techniques. Tongue 337 can be supported by tongue attachment portion 830. Central ground plane 338 can be located between top housing portion 840 and bottom housing portion 850. Central ground plane 338 can include tabs 339, which can be inserted and soldered into openings in board 230, using wave, reflow, or other solder techniques. Top housing portion 840 can support contacts (not shown) that can include contacting portions 610 and through-hole tails 612. Bottom housing portion 850 can support contacts having contacting portions 610 and through-hole tails 612. Posts 710 can extend from a bottom housing portion 850. Shield 330 can be spot or laser welded to front shield 336. In these and other embodiments of the present invention, shield 330 and front shield 336 can be formed as a single piece. Shield 330 can include tabs 334. Tongue attachment portion 830 can include tabs (not shown) that can fit into notch 842 on top housing portion 840 and a corresponding notch (not shown) on bottom housing portion 850.

Figure 9:
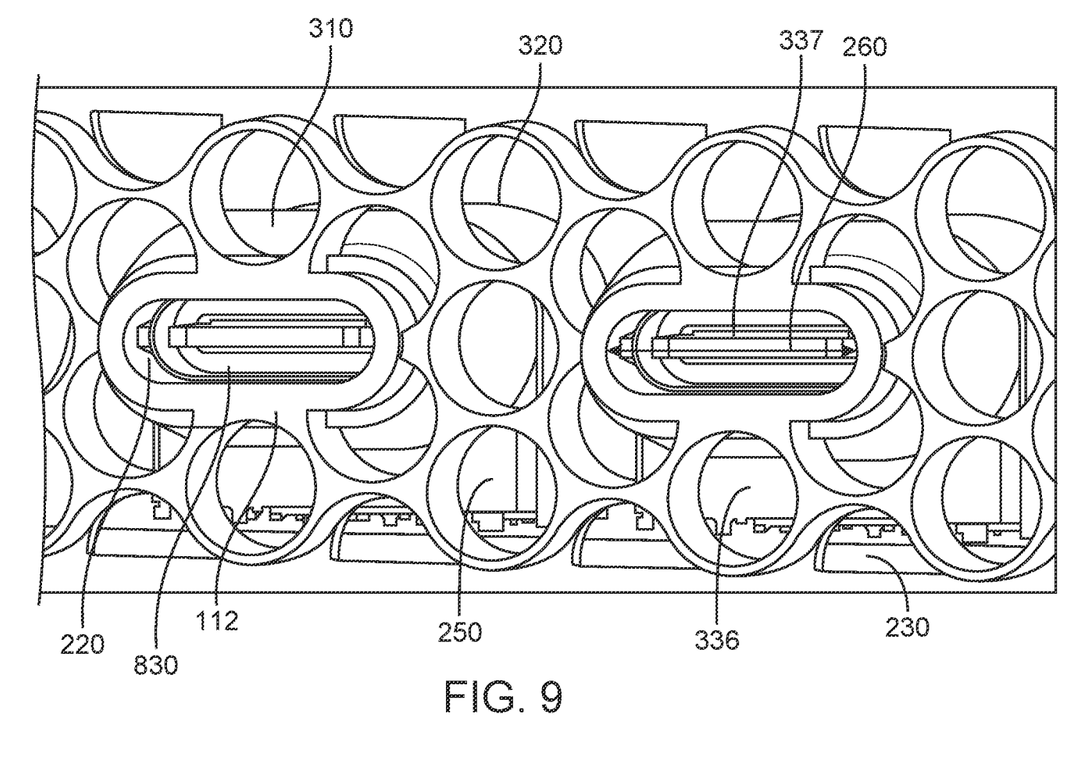
FIG. 9 illustrates a front view of a portion of a computer expansion card or other electronic device according to an embodiment of the present invention.

In these and other embodiments of the present invention, portions of connector receptacle 320 can be visible through holes or perforations 250 in enclosure wall 112 (shown in FIG. 9.) For example, portions of front shield 336 and tongue attachment portion 830 can be metallic and as a result, can be noticeable. To further the appearance that connector receptacles 320 are floating in the mesh formed by holes or perforations 250, these surfaces can be covered or colored to have a reduced visibility. In this example, cosmetic tape 810 can be attached to front shield 336 and cosmetic tape 820 can be attached around tongue 337 and front of tongue attachment portion 830. Cosmetic tape 810 and 820 can have a color that is similar to a color of enclosure wall 112. Cosmetic tape 810 and 820 can have a dark color, such as black, to provide a less noticeable appearance. In these and other embodiments of the present invention, a conductive black PVD process can be used to give these and other surfaces a less noticeable appearance. In these and other embodiments of the present invention, these and other surfaces can be painted, pad printed, plated, laser darkened, or other colored in other ways to be less noticeable.

FIG. 9 illustrates a front view of a portion of a computer expansion card or other electronic device according to an embodiment of the present invention. Enclosure wall 112 can include a number of holes or perforations 250. Enclosure wall 112 can further include a number of openings 220 for connector receptacles 320. In this example, each connector receptacle 320 can include tongue 337. In these and other embodiments of the present invention, one or more connector receptacle 320 might not have a tongue 337. For example, one or more connector receptacle 320 can be Lightning connector. Connector receptacles 320 can be mounted on board 230.

These and other embodiments of the present invention can provide connector receptacles 320 and enclosure walls 112 having an aesthetically pleasing appearance. For example, even though enclosure wall 112 can have a number of holes or perforations 250 for a mesh appearance, connector receptacles 320 might only be visible to a limited extent. For example, tapered sleeves 310 can provide a minimal front aperture 260 for an improved appearance. Tapered sleeves 310 can limit the visibility of connector receptacles 320 and their structures as viewed from outside the electronic device. Tapered sleeves 310 can further effectively hide conductive structures 340 (shown in FIG. 3) used to connect sleeves 310 and connector receptacles 320. Locating conductive structures 340 between connector receptacle front ends 321 (shown in FIG. 3) and sleeves 310 and away from the enclosure wall 112 can allow conductive structures 340 to be set further back into the electronic device, thereby making the connector receptacles 320 less visible. Some or all of enclosure walls 112, sleeves 310, connector receptacle shields 330, front shields 336, and tongue attachment portion 830 can be darkened to absorb light and reduce reflections. For example, cosmetic tape 810 can be used to darken or change the appearance of front shield 336 while cosmetic tape 820 can be used to darken or change the appearance of tongue attachment portion 830, as shown in FIG. 8. In these and other embodiments of the present invention, portions of connector receptacle tongues 337 or other structures can similarly be darkened to absorb light, reduce reflections, and match an enclosure wall. Some of all of these structures can be darkened using a conductive black PVD process, cosmetic tape, paint, pad printing, plating, laser darkening, or other process or material. In these and other embodiments of the present invention, printed circuit board 230 can be colored to match one or more of enclosure wall 112, sleeves 310, and connector receptacle 320. For example, these structures can each be colored black, though they can have other colors as well. This can give connector receptacle openings 220 in enclosure wall 112 the appearance that they are floating in the mesh.

These enclosure walls 112 and sleeves 310 can be formed in various ways in these and other embodiments of the present invention. For example, they can be formed by machining, such as by using computer numerical controlled machines, stamping, forging, metal-injection molding, micro-machining, 3-D printing, or other manufacturing process. Enclosure wall 112 and sleeves 310 can be integrally formed, or they can be formed separately and then attached. Enclosure walls 112 can be formed of plastic, for example by injection molding, while sleeves 310 can be formed of metal, for example using a deep-drawn process. These enclosure walls 112 and sleeves 310 can be formed of various materials. For example, they can be formed of aluminum, steel, stainless steel, copper, bronze, or other material. In these and other embodiments of the present invention, a material having good electrical and thermal conductivity can be chosen.

Boards 230 in computer expansion card or other electronic device 300 can be a printed circuit board, which can be made of FR4, flexible circuit board, or other appropriate substrate.

Figure 10:
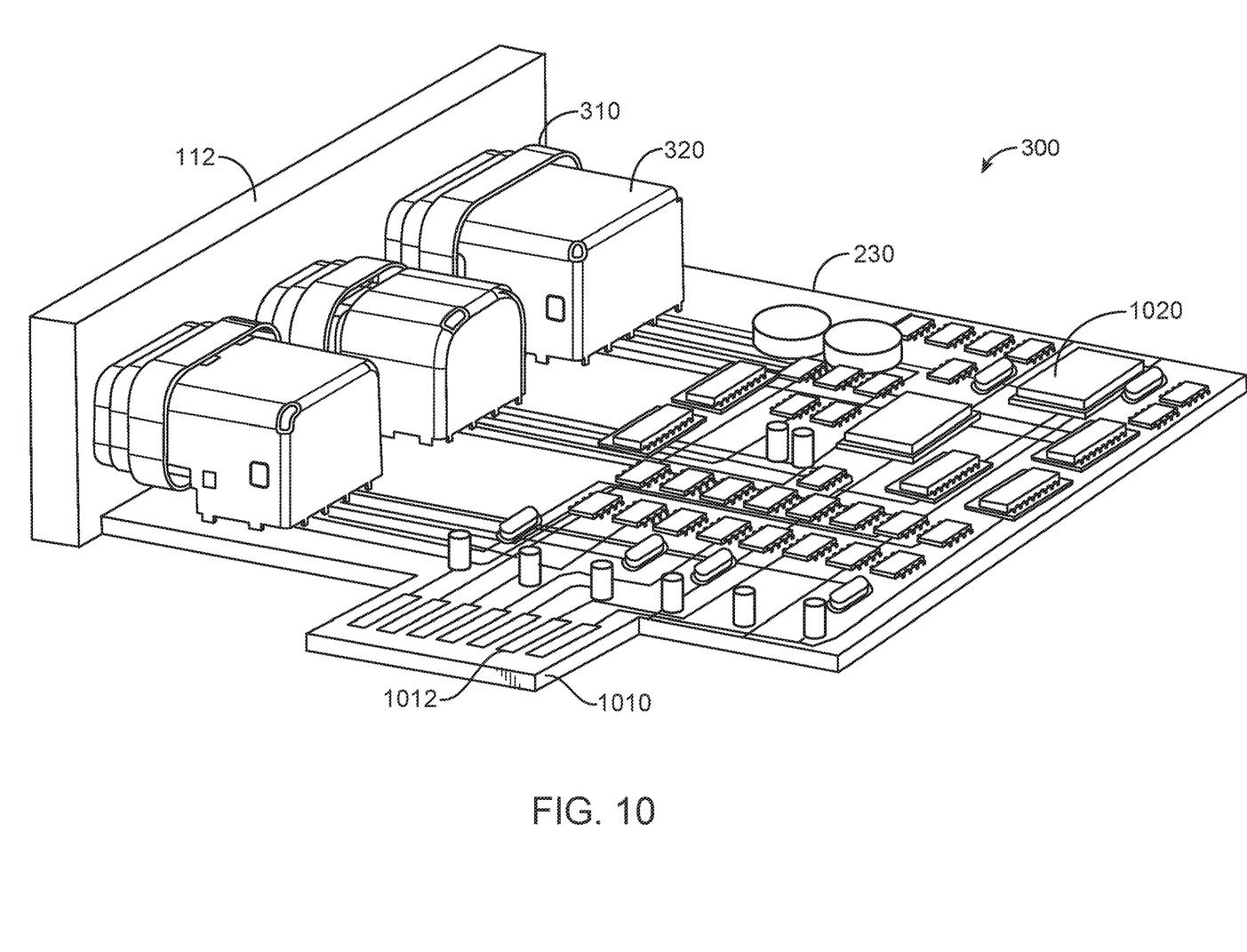
FIG. 10 illustrates a computer expansion card or other electronic device according to an embodiment of the present invention.

FIG. 10 illustrates a computer expansion card or other electronic device according to an embodiment of the present invention. In these and other embodiments of the present invention, computer expansion card or other electronic device 300 can be a PCIe card. Connector receptacles 320 can have front ends 321 (shown in FIG. 3) inserted into sleeves 310. Sleeves 310 can extend from enclosure wall 112. Board 230 can include one, two, three, or more tabs 1010 to fit in a socket on a second board (not shown), such as a main logic board for a computer system. A number of contacts 1012 can be electrically connected to electronic circuits 1020 and connector receptacles 320. In these and other embodiments of the present invention, tabs 1010 and contacts 1012 can be omitted, for example where computer expansion card or other electronic device 300 is not a computer expansion card but is instead another type of electronic device.

Embodiments of the present invention can be employed in computer expansion cards, such as computer expansion card or other electronic device 300. These and other embodiments of the present invention can be employed in other electronic devices or as other parts of electronic devices. For example, enclosure wall 112 can be a cover for computer expansion card or other electronic device 300 while board 230 can be a board for computer expansion card or other electronic device 300. In other embodiments of the present invention, enclosure wall 112 can be a different portion of a device enclosure for an electronic device. For example, enclosure wall 112 can be a device enclosure that substantially houses an electronic device. Board 230 can be a main logic board or other board in the electronic device.

In various embodiments of the present invention, contacts, ground pads, enclosure walls, sleeves, shields, and other portions of connector receptacle and device enclosures can be formed by stamping, metal-injection molding, machining, micro-machining, 3-D printing, or other manufacturing process. These portions can be formed of stainless steel, steel, copper, copper titanium, phosphor bronze, or other material or combination of materials. They can be plated or coated with nickel, gold, or other material. Other portions, such as connector receptacle housings, and other structures can be formed using injection or other molding, 3-D printing, machining, or other manufacturing process. These portions can be formed of silicon or silicone, rubber, hard rubber, plastic, nylon, liquid-crystal polymers, ceramics, or other nonconductive material or combination of materials.

Embodiments of the present invention can provide connector receptacles and device enclosures that can be located in, or can connect to, various types of devices, such as portable computing devices, tablet computers, desktop computers, laptops, all-in-one computers, wearable computing devices, smart phones, storage devices, portable media players, navigation systems, monitors, power supplies, video delivery systems, adapters, remote control devices, chargers, and other devices. These connector receptacles can provide interconnect pathways for signals that are compliant with various standards such as one of the Universal Serial Bus (USB) standards including USB Type-C, High-Definition Multimedia Interface®, Digital Visual Interface, Ethernet, DisplayPort, Thunderbolt™, Lightning™, Joint Test Action Group, test-access-port, Directed Automated Random Testing, universal asynchronous receiver/transmitters, clock signals, power signals, and other types of standard, nonstandard, and proprietary interfaces and combinations thereof that have been developed, are being developed, or will be developed in the future. Other embodiments of the present invention can provide connector receptacles that can be used to provide a reduced set of functions for one or more of these standards. In various embodiments of the present invention, these interconnect paths provided by these connector receptacles can be used to convey power, ground, signals, test points, and other voltage, current, data, or other information.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising:
    a section of a device enclosure for the electronic device, the section of the device enclosure comprising:
    an enclosure wall having an opening; and
    a sleeve integrally formed with the enclosure wall, the sleeve having a front aperture aligned with the opening in the enclosure wall, the sleeve extending into the electronic device from the enclosure wall;
    a board; and
    a connector receptacle comprising:
    a tongue located in the sleeve;
    a plurality of contacts having contacting portions on the tongue and contact tails attached to the board; and
    a shield around a portion of the connector receptacle and electrically connected to the sleeve.

2. The electronic device of claim 1 further comprising a compliant structure between the shield and the sleeve and forming an electrical connection.

3. The electronic device of claim 1 further comprising a conductive gasket between the shield and the sleeve and forming an electrical connection.

4. The electronic device of claim 3 wherein the sleeve is stepped such that it widens in steps away from the enclosure wall.

5. The electronic device of claim 3 wherein the sleeve progressively widens in steps away from the enclosure wall.

6. The electronic device of claim 3 wherein the sleeve has a front aperture at the opening in the enclosure wall and a rear aperture at an opposing end, the rear aperture wider than the front aperture.

7. The electronic device of claim 3 wherein the enclosure wall comprises a plurality of perforations.

8. The electronic device of claim 3 wherein the enclosure wall comprises a plurality of holes.

9. The electronic device of claim 3 wherein the enclosure wall is conductive.

10. The electronic device of claim 3 wherein a portion of the enclosure wall is conductive.

11. A computer expansion card for an electronic device, the computer expansion card comprising:
    an enclosure wall having an opening; and
    a sleeve integrally formed with the enclosure wall, the sleeve having a front aperture aligned with the opening in the enclosure wall, the sleeve extending into the electronic device from the enclosure wall;
    a board comprising a plurality of pads along a first edge;
    a connector receptacle comprising:
    a tongue located in the sleeve;
    a plurality of contacts having contacting portions on the tongue and contact tails attached to the board; and
    a shield around a portion of the connector receptacle and electrically connected to the sleeve; and
    electronic circuitry located on the board and electrically connected to a pad in the plurality of pads on the board and a contact in the plurality of contacts in the connector receptacle.

12. The card of claim 11 further comprising a conductive gasket between the shield and the sleeve and forming an electrical connection.

13. The card of claim 12 wherein the sleeve has a front aperture at the opening in the enclosure wall and a rear aperture at an opposing end, the rear aperture wider than the front aperture.

14. The card of claim 13 wherein the sleeve is stepped such that it widens in steps away from the enclosure wall.

15. The card of claim 13 wherein the enclosure wall comprises a plurality of perforations.

16. The card of claim 13 wherein the enclosure wall comprises a plurality of holes.

17. The card of claim 16 wherein the enclosure wall is conductive.

18. The card of claim 12 wherein the electronic circuitry comprises a graphics processor.

19. The card of claim 12 wherein the electronic circuitry comprises networking circuitry.

20. The card of claim 12 wherein the enclosure wall and sleeve are conductive.

* * * * *